(12) United States Patent
Lee

(10) Patent No.: US 6,809,973 B2
(45) Date of Patent: Oct. 26, 2004

(54) FLASH MEMORY DEVICE CAPABLE OF REPAIRING A WORD LINE

(75) Inventor: Ju Yeab Lee, Ichon-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/633,730

(22) Filed: Aug. 4, 2003

(65) Prior Publication Data

US 2004/0125669 A1 Jul. 1, 2004

(30) Foreign Application Priority Data

Dec. 27, 2002 (KR) .................................. 10-2002-0085507

(51) Int. Cl.$^7$ ................................................ G11C 7/00
(52) U.S. Cl. ...................... 365/200; 365/49; 365/230.06
(58) Field of Search ...................... 365/200, 49, 230.06, 365/185.33

(56) References Cited

U.S. PATENT DOCUMENTS 5,200,922 A    4/1993  Rao
5,774,396 A    6/1998  Lee et al.
6,385,071 B1 * 5/2002  Chai et al. .................... 365/49

FOREIGN PATENT DOCUMENTS

| DE | 693 24 694 | 6/1995 |
| DE | 695 00 143 | 9/1995 |
| GB | 2 254 173  | 9/1992 |
| GB | 2 308 693  | 7/1997 |

* cited by examiner

*Primary Examiner*—David Lam
(74) *Attorney, Agent, or Firm*—Marshall, Gerstein & Borun LLP

(57) ABSTRACT

Disclosed is the flash memory device capable of repairing the word line. Fail word lines are repaired using redundancy cells for repairing bit lines by combining X/Y addresses, whereby repair in the direction of the bit line as well as repair in the direction of the word line is made possible. Therefore, it is possible to prevent degradation in the yield and improve reliability of the device.

7 Claims, 4 Drawing Sheets

FLASH MEMORY DEVICE CAPABLE OF REPAIRING A WORD LINE

BACKGROUND OF THE INVENTION

1. Field of the Invention

The present invention relates to a flash memory device capable of repairing a word line, and more particularly, to a flash memory device capable of repairing a word line, which can repair fail word lines in a main cell array using a bit line redundancy cell array.

2. Background of the Related Art

In general, if fail occurs in the flash memory cell array due to defect, etc., the fail cell is replaced with an extra cell in order to prevent reduction in the yield. For this purpose, a bit line redundancy cell array in addition to a main cell array is provided in the flash memory device. The redundancy cells are only used to repair fail or single cell fail in the direction of the bit line for the most part. Accordingly, in the prior art, in case where fail occurred in the direction of the word line, one chip is treated as fail without a special repair method.

Meanwhile, in case where fail occurred in the direction of the word line, the word line redundancy cell array having the same number to the number of the cells connected to one the word line must be provided in the main cell array in order to repair fail. In this case, there are problems that lots of areas are required and it is difficult to integrate the device, since the width of the word line redundancy cell array must be same to that of the main cell array. Furthermore, in case where cells that are failed in the direction of the word line are repaired within the sector, the cells of the word line that are failed upon erasing the sector are over erased while they are continuously erased. Due to this, the leakage current is generated in the bit line and all the cells formed in the same well region could not be thus used.

In particular, in a prior art that the word line is repaired within the flash EEPROM sector array, the same bias is applied to the word line and the P well in order to repair the word line. In this case, however, repair is performed in a word line to word line mode. Accordingly, there are disadvantages that a well region of the word line redundancy cell array and a well region of the main cell array have to be separated in order to block the leakage current occurring by the fail cell and the chip size is increased.

SUMMARY OF THE INVENTION

Accordingly, the present invention is contrived to substantially obviate one or more problems due to limitations and disadvantages of the related art.

An object of the present invention is to provide a flash memory device capable of repairing a word line, which can prevent degradation in the yield and improve reliability of the device, in such a manner that fail word lines are repaired using redundancy cells for repairing bit lines by combining x/Y addresses, thus allowing repair in the direction of the bit line as well as repair in the direction of the word line.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a word line repair circuit in a flash memory device according to one embodiment of the present invention is characterized in that it comprises a main cell array in which a plurality of cell are classified in a I/O block unit, a redundancy cell array consisting of repair blocks in which the number of word lines is equivalent to the number of columns constituting the I/O block and the number of cells connected to the word line is equivalent to the number of the I/O block, a CAM cell array for storing information including information on a fail word line of the main cell array and connection information on the repair block instead of the fail word line, a word line voltage switching unit for transferring a word line voltage applied to the fail word line to the redundancy cell array according to information on the fail word line, and a word line select means enabled by the connection information, for selecting a word line of the repair block corresponding to a column of the I/O block according to the column select signal of the main cell array and then applying the word line voltage to the selected word line, wherein data to be stored through the fail word line are sequentially stored through a corresponding column of the repair block in a I/O block unit, thereby repairing the fail word line.

In the above, the I/O block may be 16 in number. At this time, the I/O block may include 1024 word lines and 64 columns and the repair block may include 64 word lines and 16 columns.

Meanwhile, the word line voltage switching unit comprises first switching means each connected between the word line voltage supply terminal and the word line of the main cell array and driven by a fail word line signal of the CAM cell array;

an inverter for inverting the fail word line signal, and a second switching means for transferring the word line voltage to the word line select means according to the fail word line inverted signal from the inverter. At this time, the first switching means and the second switching means may be field effect transistors.

The word line select means is provided every repair block. The word line select means comprises a first switching means driven by an enable signal depending on the connection information stored at the CAM cell array, for switching the word line voltage, and a plurality of switching means each connected between the first switching means and the word line of the repair block, for switching the word line voltage to a word line of a repair block corresponding to a corresponding column according to the column select signal of the main cell array.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1:
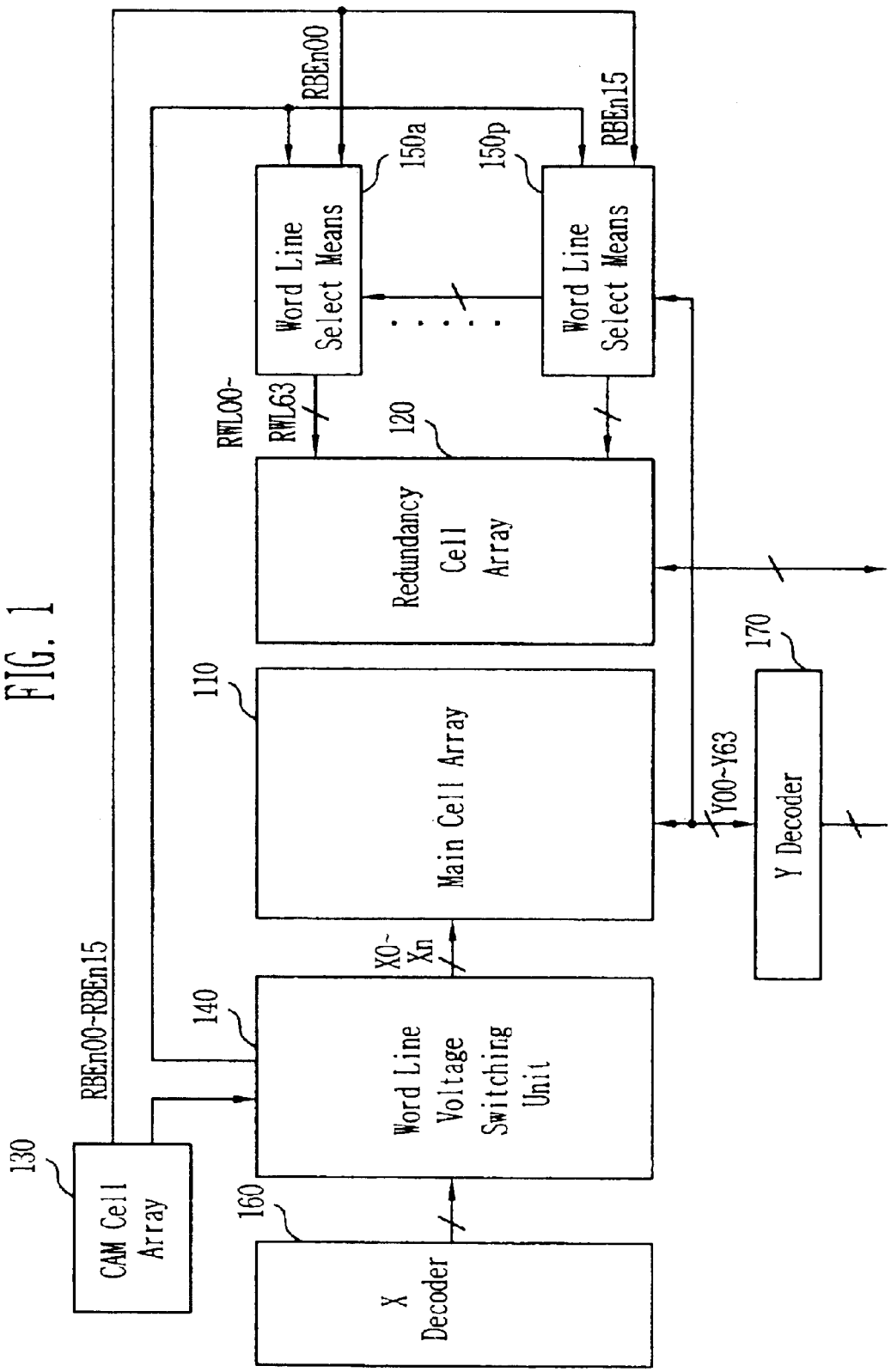
FIG. 1 is a block diagram of a word line repair circuit in a flash memory device for explaining the construction and operation of the word line repair circuit according to a preferred embodiment of the present invention.

Reference will now be made in detail to the preferred embodiments of the present invention, examples of which are illustrated in the accompanying drawings, in which like reference numerals are used to identify the same or similar parts.

Figure 2:
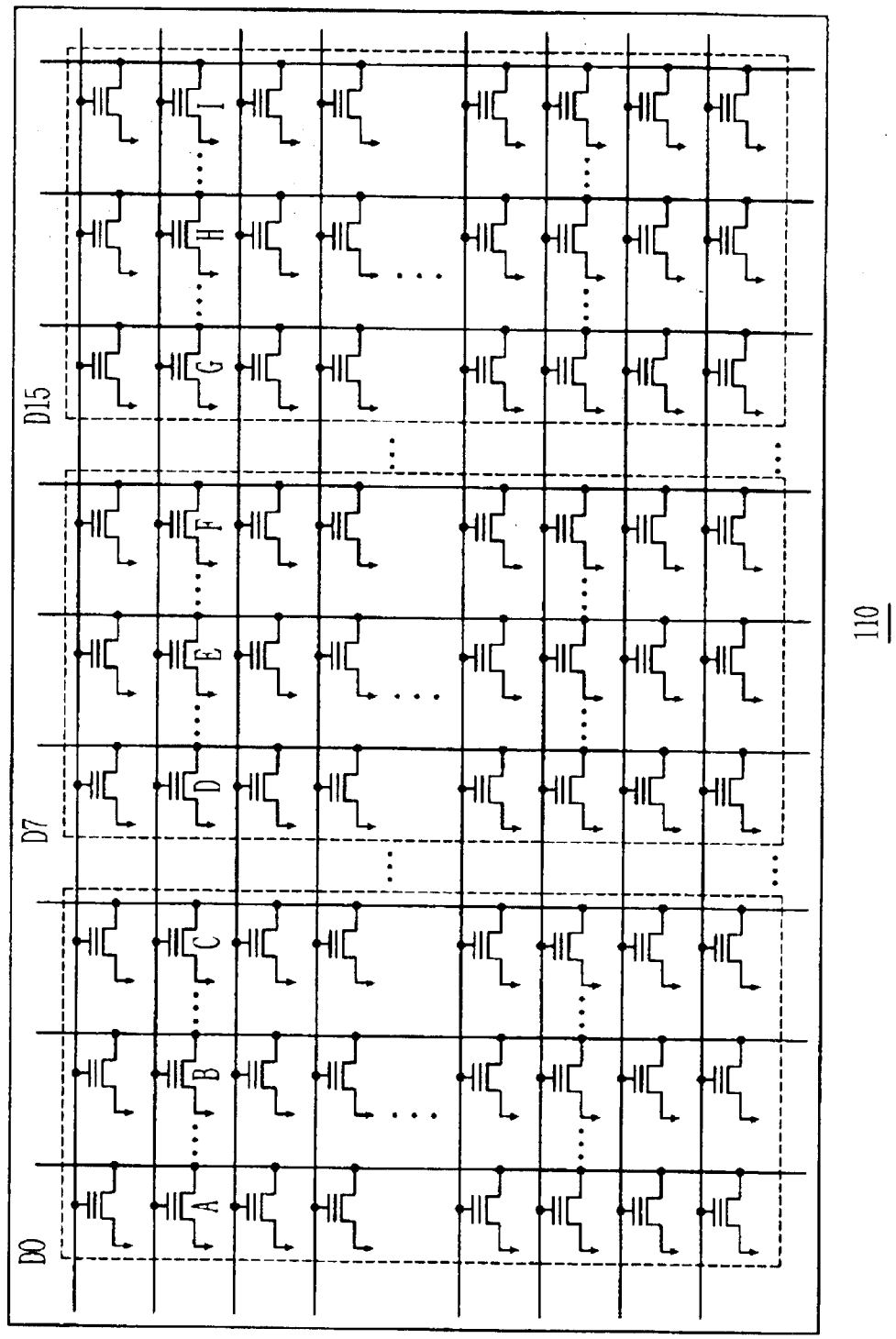
FIG. 2 is circuit diagram for explaining the construction of the main cell array shown in FIG. 1.
Figure 3:
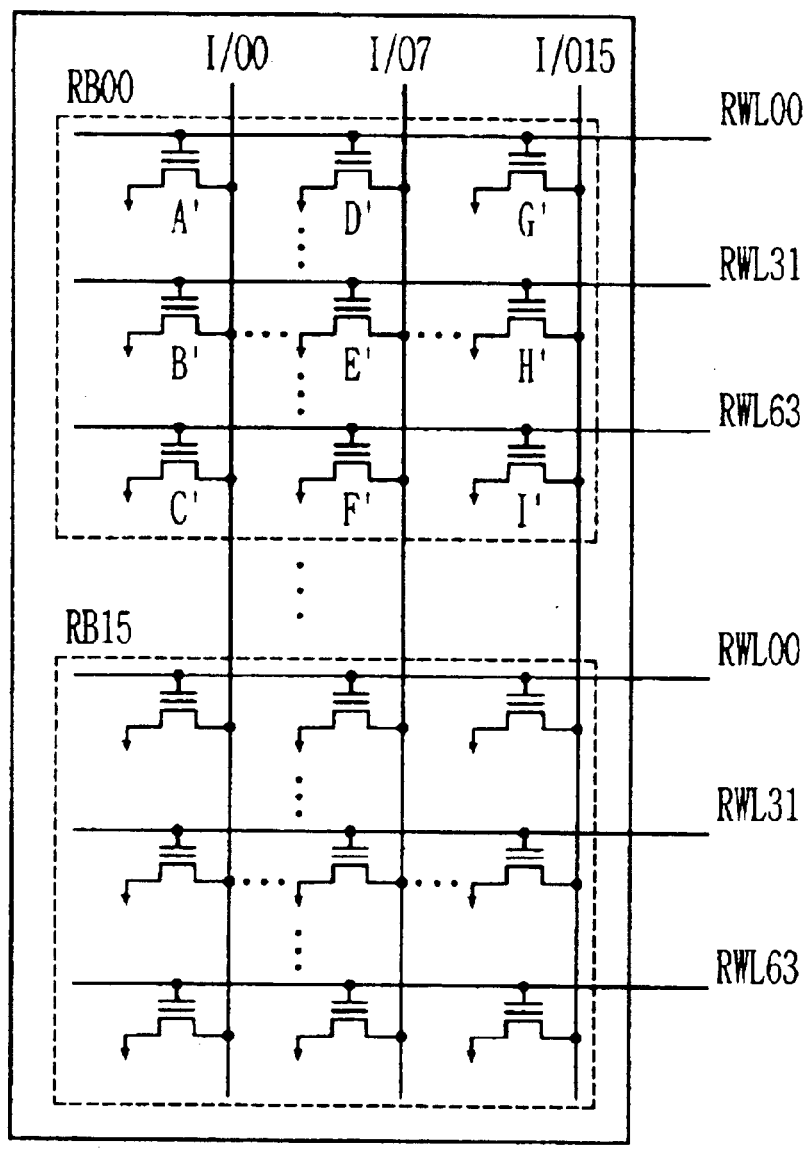
FIG. 3 is circuit diagram for explaining the construction of the redundancy cell array shown in FIG. 1.

FIG. 1 is a block diagram of a word line repair circuit in a flash memory device for explaining the construction and operation of the word line repair circuit according to a preferred embodiment of the present invention; FIG. 2 is circuit diagram for explaining the construction of the main cell array shown in FIG. 1; and FIG. 3 is circuit diagram for explaining the construction of the redundancy cell array shown in FIG. 1.

Referring to FIG. 1, the word line repair circuit comprises a main cell array 110, a redundancy cell array 120, a CAM cell array 130, a word line voltage switching unit 140, word line select means 150a through 150p, a X decoder 160 and a Y decoder 170.

In the above, the main cell array 110 consists of a plurality of cells. As shown in FIG. 2, the plurality of the cells are classified into I/O blocks D0 through D15 units. In other words, the cells included in the same I/O block are connected to the same I/O terminal. At this time, in order to facilitate understanding on the present invention, a case where cells of 1024 in number are connected to one word line and 64 cells are connected to the word line every I/O block will be described as an example. Thus, columns of 64 in number exist in the I/O block.

The redundancy cell array 120 consists of a plurality of cells. The plurality of the cells are classified into a plurality of repair blocks. The redundancy cell array 120 is for one for repairing a fail word line of the main cell array 110. A bit line redundancy cell array (not shown) for replacing a fail bit line of the main cell array 110 is additionally included. At this time, in order to facilitate understanding on the present invention, a case where the repair blocks RB00 through RB15 of 16 in number are provided in the redundancy cell array 120 will be described as an example. Meanwhile, the repair blocks RB00 through RB15 are classified so that the number of the word line is equivalent to the number of the column (64 in number) constituting the I/O block of the main cell array 110 and the number of the cell connected to each of the word lines RWL00 through RWL63 is equivalent to the number of the I/O block (16 in number), as shown in FIG. 3. Thereby, each of the repair blocks RB00 through RB15 consists of 1024 cells. This is equivalent to the number of the cell connected to the word line of the main cell array 110. In this repair block, data stored at the first I/O block D0 of the fail word line is stored at the cells connected to the first I/O terminal I/O0 (only three; A', B' and C' are shown in the drawing). In other words, the repair block stores data to be stored at the first I/O block D0 at the first column I/O0. At this time, 64 cells (only three; A, B and C are shown in the drawing) are connected to the first I/O block D0 of the main cell array 110. 64 cells (only three; A', B' and C' are shown in the drawing) are connected to the first column I/O0 of the redundancy cell array 120. Accordingly, there is nothing problem in storing data of a row direction in the direction of the column. In this manner, data to be stored at first ~$63^{th}$ cells (A, B and C) of the main cell array 110 are stored at first ~$64^{th}$ cells (A', B' and C') of the redundancy cell array 120. Data to be stored at $960^{th}$~$1024^{th}$ cells (G, H and I) are stored at $960^{th}$~$1023^{th}$ cells (G', H' and I') of the redundancy cell array 120. Through this, one fail word line occurred in the main cell array 110 is replaced with one repair block.

The CAM cell array 130 stores various information including information such as an address on a fail word line occurred in the main cell array 110, and connection information on the repair block of the redundancy cell array 120 instead of the fail word line. Of them, the CAM cell array 130 supplies information on the fail word line to the word line voltage switching unit 140. Furthermore, the CAM cell array 130 applies enable signals RBEn00 through RBEn15 for enabling the word line select means 150 connected to a corresponding repair block of the plurality of the word line select means 150a through 150p to the word line select means 150a through 150p, depending on information on whether the fail word line is replaced with which repair block (one of RB00 through RB15 in FIG. 3) of the redundancy cell array 120.

The word line voltage switching unit 140 compares a word line select signal of the main cell array 110 from the X decoder 160 with information on the fail word line stored at the CAM cell array 130 when the word line select signal is generated. As the result of the comparison, the word line voltage switching unit 140 blocks application of the word line voltage to the fail word line of the main cell array 110 and then transfers the word line voltage to the redundancy cell array 120.

Figure 4:
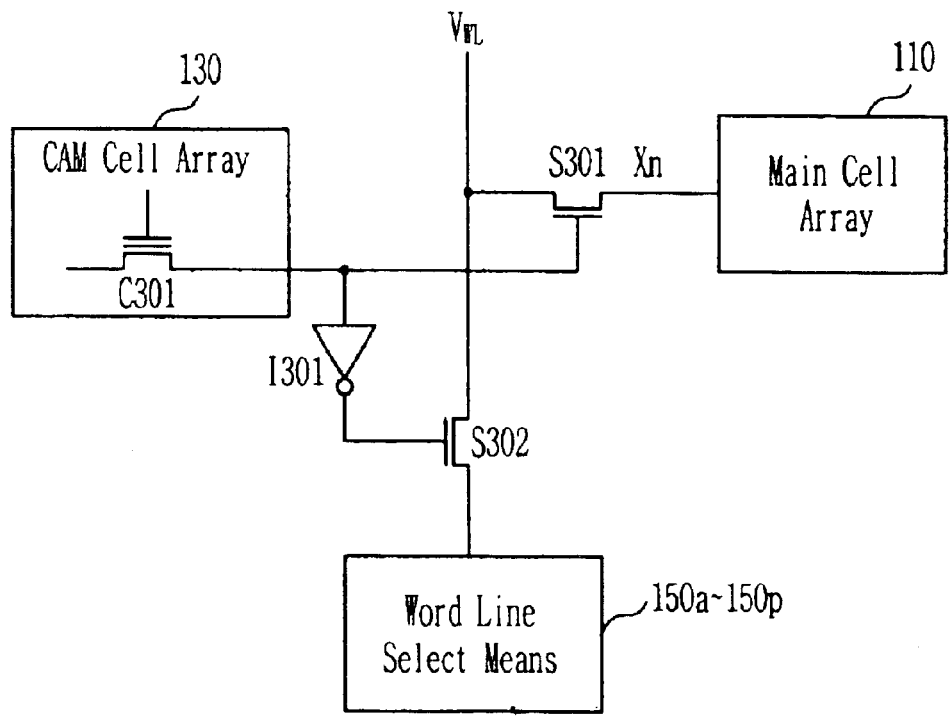
FIG. 4 is a circuit diagram for explaining the construction of the word line voltage select unit shown in FIG. 1.

The construction of the word line voltage switching unit 140 will be described in more detail by reference to FIG. 4. FIG. 4 is a circuit diagram for explaining the construction of the word line voltage select unit shown in FIG. 1.

Referring to FIG. 4, the word line voltage switching unit 140 may includes first and second switching means S301 and S302 and an inverter I301. In the above, the first switching means (S301, only one is shown in the drawing) are each connected between the word line voltage supply terminals and the word lines of the main cell array (110 in FIG. 1). The first switching means (S301) serves to switch the word line voltage $V_{WL}$ to the word line of the main cell array 110 according to the fail word line signal of the CAM cell array (130 in FIG. 1). The inverter 1301 inverts the fail word line signal generated from the CAM cell array 130 to produce a fail word line inverted signal. The second switching means (S302, only one is shown in the drawing) transfer the word line voltage $V_{WL}$ to the word line select means 150a through 150p according to the fail word line inverted signal from the inverter I301.

The word line select means 150a through 150p are enabled by the enable signal RBEn00 through RBEn15 from the CAM cell array 130. Also, the word line select means 150a through 150p select the word line (one of RWL00 through RWL63) of the repair block corresponding to a column of the I/O block according to the column select signals Y00 through Y63 from the Y decoder 170 and then applies the word line voltage to the selected word line. This will be described in more detail as follows. If the first column is selected by the column select signal Y00, the word line select means 150a enabled by the enable signal RBEn00 selects the first word line RWL00 to apply the word line voltage to the first word line RWL00 of the repair block RB00. As such, the word line select means 150a through 150p perform an operation for converting the column select signal into the word line select signal.

Figure 5:
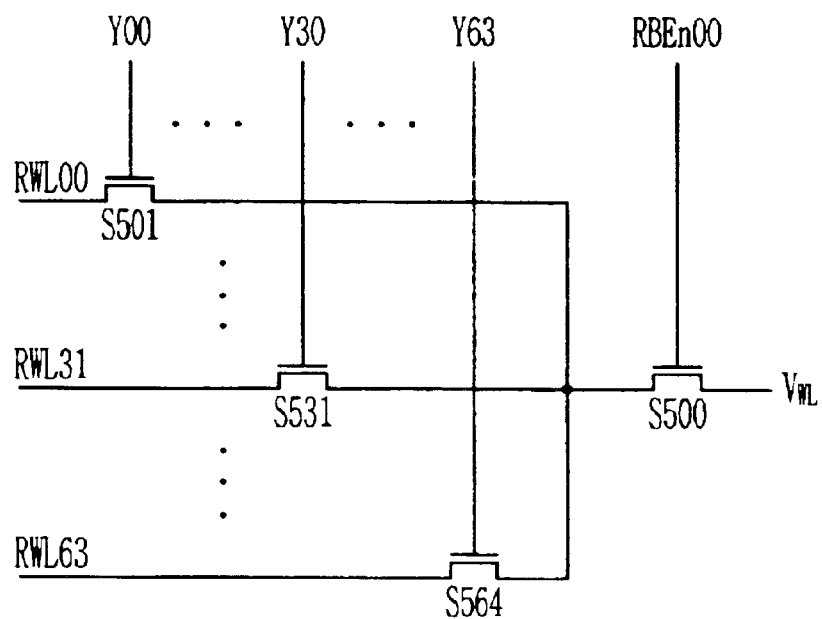
FIG. 5 is a circuit diagram for explaining the construction of the word line select means shown in FIG. 1.

The construction of the word line select means will be below described in detail by reference to FIG. 5. FIG. 5 is a circuit diagram for explaining the construction of the word line select means shown in FIG. 1.

Referring to FIG. 5, the word line select means (150a through 150p in FIG. 1) may be implemented using a first switching means S500 and a plurality of switching means S501 through S564.

In the above, the first switching means S500 is driven by the enable signal (for example RBEn00) generated depending on the connection information stored at the CAM cell array (130 in FIG. 1) and switches the word line voltage $V_{WL}$ transferred from the word line select means (150 in FIG. 1).

The plurality of the switching means S501 through S564 are connected between the first switching means S500 and the word lines RWL00 through RWL63 of the repair block, respectively. The plurality of the switching means S501 through S564 switch the word line voltage $V_{WL}$ to the word line of the repair block corresponding to a corresponding column according to the column select signals Y00 through Y63 of the main cell array (110 in FIG. 1).

Through the above construction, the word line repair circuit in the flash memory device of the present invention repairs the fail word line by sequentially storing data to be stored at the fail word lines at corresponding columns of the repair block in a I/O block unit.

The operation of the word line repair circuit in the flash memory device of the present invention will be described in detail by reference to FIG. 1~FIG. 5, using a case where the second word line of the main cell array 110 that was failed is replaced with the first repair block RB00 of the redundancy cell array 120 as an example.

First, if the second word line of the main cell array 110 is failed, information on the address of the second word line and information on whether the fail word line is replaced with which the repair block of the redundancy cell array 120, are stored at the CAM cell array 130. At this time, it is assumed that the second word line is replaced with the first repair block RB00 of the redundancy cell array 120.

In the word line voltage switching unit 140, the first switching means (S301 in FIG. 4) connected to the second word line of the main cell array 110 is turned off and the second switching means S302 is turned on, according to information on the fail word line that was stored at the CAM cell array 130, as shown in FIG. 4. Therefore, in the program or read operation, the word line voltage $V_{WL}$ is not transferred to the second word line of the main cell array 110 but transferred to the word line select means 150a through 150p connected to the redundancy cell array 120, by the word line voltage switching unit 140.

In this state, if the second word line being a fail word line is selected in the program or read operation, the first enable signal RBEn00 is applied to the first word line select means 150a according to replacement information of the fail word line stored at the CAM cell array 130.

As in FIG. 1 and FIG. 5, while the first switching means S500 of the first word line select means 150a is turned on by the first enable signal RBEn00, the first word line select means 150a is enabled and the word line voltage $V_{WL}$ is switched to the second ~65$^{th}$ switching means S501 through S564. At this time, the column select signals Y00 through Y63 of the Y decoder 170 that are applied to the main cell array 110 are also applied to the first word line select means 150a. Meanwhile, although the column select signals Y00 through Y63 are applied to the second~sixteenth word line select means 150b through 150p, the second~sixteenth word line select means 150b through 150p do not operate since only the first word line select means 150a is enabled by the first enable signal RBEn00.

If a first cell (A in FIG. 2) of the first I/O block (D in FIG. 2) in the main cell array 110 is selected by the column select signal Y00 with the first word line select means 150a enabled, the second switching means (S501 in FIG. 5) of the first word line select means 150a) is turned on by the column select signal Y00. As a result, the first word line RWL00 is selected and the word line voltage $V_{WL}$ transferred from the first switching means S500 is switched to the first word line RWL00 of the first repair block RB00.

Although 16 cells (only three; A', D' and G' are shown in the drawing) are connected to the first word line RWL00, only the first cell A' is connected to the first I/O terminal I/O0 same to the first cell (A in FIG. 2) of the first I/O block (D0 in FIG. 2) in the main cell array 110. Therefore, only the first cell (A') of the first word line RWL00 performs the same program or read operation to the first cell (A in FIG. 2) of the first I/O block (D0 in FIG. 2) in the main cell array 110 but the remaining cells do not operate.

In this manner, data to be stored at a first cell (A in FIG. 2) of the first I/O block (D0 in FIG. 2) in the main cell array 110 is stored at a first cell (A') of the first repair block RB00 in the redundancy cell array 120. Also, in the read operation, data stored at the first cell (A') of the first repair block RB00 in the redundancy cell array 120 is read instead of the first cell (A in FIG. 2) of the first I/O block (D0 in FIG. 2) in the main cell array 110.

Furthermore, data to be stored at the 16 cells (only three; A, B and C are shown in FIG. 2) included in the first I/O block of the second word line in the main cell array 110 are stored at the 16 cells (only three; A', B' and C' are shown in FIG. 3) connected to the first I/O terminal (I/O0) of the first repair block RB00 in the redundancy cell array 120 and read therefrom, through the above operation.

Data to be stored at the 16 cells (only three; D, E and F are shown in FIG. 2) included in the eighth I/O block of the second word line in the main cell array 110 are stored at the 16 cells (only three; D', E' and F" are shown in FIG. 3) connected to the eighth I/O terminal I/O7 of the first repair block RB00 in the redundancy cell array 120 and read therefrom.

Data to be stored at the 16 cells (only three; G, H and I are shown in FIG. 2) included in the sixteenth I/O block of the second word line in the main cell array 110 are stored at the 16 cells (only three; G', H' and I' are shown in FIG. 3) connected to the sixteenth I/O terminal I/O15 of the first repair block RB00 in the redundancy cell array 120 and read therefrom.

Through the above operation, the word line could be repaired by a fail word line with the first repair block RB00 of the redundancy cell array 120.

As described above, according to the present invention, a fail word line as well as a fail bit line could be repaired. Therefore, the present invention has new effects that it can prevent degradation in the yield and improve reliability of the device.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A word line repair circuit in a flash memory device, comprising:

a main cell array in which a plurality of cell are classified in a I/O block unit;

a redundancy cell array consisting of repair blocks in which the number of word lines is equivalent to the number of columns constituting the I/O block and the number of cells connected to the word line is equivalent to the number of the I/O block;

a CAM cell array for storing information including information on a fail word line of the main cell array and connection information on the repair block instead of the fail word line;

a word line voltage switching unit for transferring a word line voltage applied to the fail word line to the redundancy cell array according to information on the fail word line; and a word line select means enabled by the connection information, for selecting a word line of the repair block corresponding to a column of the I/O block according to the column select signal of the main cell array and then applying the word line voltage to the selected word line, wherein data to be stored through the fail word line are sequentially stored through a corresponding column of the repair block in a I/O block unit, thereby repairing the fail word line.

2. The word line repair circuit as claimed in claim 1, wherein the I/O block is 16 in number.

3. The word line repair circuit as claimed in claim 1, wherein the I/O block consists of 1024 word lines and 64 columns and the repair block consists of 64 word lines and 16 columns.

4. The word line repair circuit as claimed in claim 1, wherein the word line voltage switching unit comprises:

first switching means each connected between the word line voltage supply terminal and the word line of the main cell array and driven by a fail word line signal of the CAM cell array;

an inverter for inverting the fail word line signal; and a second switching means for transferring the word line voltage to the word line select means according to the fail word line inverted signal from the inverter.

5. The word line repair circuit as claimed in claim 4, wherein the first switching means and the second switching means are field effect transistors.

6. The word line repair circuit as claimed in claim 1, wherein the word line select means is provided every repair block.

7. The word line repair circuit as claimed in claim 1, wherein the word line select means comprises:

a first switching means driven by an enable signal depending on the connection information stored at the CAM cell array, for switching the word line voltage; and a plurality of switching means each connected between the first switching means and the word line of the repair block, for switching the word line voltage to a word line of a repair block corresponding to a corresponding column according to the column select signal of the main cell array.

* * * * *